United States Patent [19]

Powers et al.

[11] 4,289,977
[45] Sep. 15, 1981

[54] CMOS COMPATIBLE BIPOLAR DRIVE CIRCUIT WITH PROTECTIVE CLAMP

[75] Inventors: Vernon B. Powers; Harry I. Crawford, both of St. Petersburg, Fla.

[73] Assignee: E-Systems, Inc., Dallas, Tex.

[21] Appl. No.: 914,863

[22] Filed: Jun. 12, 1978

[51] Int. Cl.³ .................. H03K 3/01; H03K 17/16; H03K 5/02

[52] U.S. Cl. .................................. 307/270; 307/315; 307/567; 307/DIG. 1

[58] Field of Search ............ 307/260, 270, 214, 237, 307/315, DIG. 1

[56] References Cited

U.S. PATENT DOCUMENTS

| | | | |
|---|---|---|---|
| 3,553,486 | 1/1971 | Dow ........................... | 307/237 X |
| 3,601,626 | 8/1971 | Hoffmann et al. ............ | 307/203 |
| 3,753,008 | 8/1973 | Guarnaschelli ............... | 307/270 |
| 3,786,442 | 1/1974 | Alexander et al. ........... | 340/173 R |
| 3,868,517 | 2/1975 | Schoeff ........................ | 307/270 |
| 3,937,988 | 2/1976 | De Clue et al. .............. | 307/297 |
| 4,037,118 | 7/1977 | Sieborger et al. ............ | 307/255 |

Primary Examiner—John Zazworsky
Attorney, Agent, or Firm—Albert M. Crowder, Jr.; Robert V. Wilder

[57] ABSTRACT

A bipolar drive circuit for driving a load, such as a printer, is compatible with complementary metal oxide semiconductor (CMOS) circuitry and may be driven by a non-inverting hex buffer. Connected to the input of the drive circuit is a clamp circuit for providing a shunt path to ground for leakage currents during floating or open circuit conditions at the input. The output of the drive circuit includes a plurality of transistors connected in a complementary Darlington configuration to provide the necessary current gain to drive a conventional output, medium power, transistor. A diode is connected between the input of the drive circuit and ground for protection.

8 Claims, 4 Drawing Figures

| TEMP(°C) | $V_{in}$(V) | INTERFACE | DUTY CYCLE | FREQ (HZ) | SUPPLY VOLTAGE | LOAD | $P_D$ (mw) |
|---|---|---|---|---|---|---|---|
| 25 | 5.0 | CMOS |  | SS "0" | 12.0 | 8* | 88.0 |
| 125 | ↑ | ↑ |  | ↑ "0" | ↑ | ↑ | 80.0 |
| -55 |  |  |  | "0" |  |  | 74.0 |
| 25 |  |  |  | "1" |  |  | 0 |
| 125 |  |  |  | "1" |  |  | 0 |
| -55 |  |  |  | SS "1" |  |  | 0 |
| 25 |  |  | 10% | 100 |  |  | 11.2 |
| 125 |  |  | 10% | 100 |  |  | 8.0 |
| -55 | ↓ | ↓ | 10% | 100 | ↓ | ↓ | 14.8 |
| 25 | 5.0 | CMOS | 10% | 1K | 12.0 | 8* | 9.6 |

NOTE:
SS = STEADY STATE
* = WORSE CASE LOAD

CMOS COMPATIBLE BIPOLAR DRIVE CIRCUIT WITH PROTECTIVE CLAMP

FIELD OF THE INVENTION

The present invention relates to drive circuits, and particularly to drive circuits with clamping protection connected at the drive circuit input.

BACKGROUND OF THE INVENTION

Drive circuits have long been used to amplify and transmit a signal from an input source to a load and associated circuitry. One application of such drive circuitry is in a thermal printer connected between a logic signal source and a thermal print element. For driving a thermal printer, drive circuits usually drive an output power transistor that, in turn, drives a thermal print wafer.

Although previously available drive circuits have been generally satisfactory for use in printers, a number of problems have been associated with such conventional drive circuits. Often, the drive circuitry included no provisions for protecting the output power transistor or the load during open circuit or floating conditions at the drive circuit input. Such input conditions often resulted in leakage currents in the drive circuit that caused a logic "1" or "on" condition at the drive circuit output. Responding to the logic "1" condition, the output transistor would turn "on" and a steady state current flowed through the thermal print wafer. Since neither the output transistor nor the wafer were usually designed for a steady state "on" operation, one or both of these elements would be destroyed.

Furthermore, conventional drive circuits have, in the past, produced undue power dissipation through the use of a drain resistor on the output transistor of the drive circuit. In many conventional drive circuits, it was necessary to hand match transistors to gain desired performance characteristics. Hand matching is an expensive and time consuming operation. Also, heretofore available drive circuits have been expensive, relatively unreliable and difficult to build because of the large number of chips and wire bonds necessary.

SUMMARY OF THE INVENTION

In accordance with the present invention, a drive circuit is provided for driving an electrical load in response to a signal from an input source. The drive circuit includes a current amplifier for generating a signal at its output in response to a signal received at the input thereof, and the output of the current amplifier is connected for driving the load. A clamp circuit is connected between the input of the current amplifier and ground for shunting leakage currents from the input during open circuit and floating conditions at the input. In this manner the output of the current amplifier is maintained at a low voltage condition with no appreciable current flow through the load during open circuit and floating conditions at the input.

The clamp circuit controls the flow of current from the input of the current amplifier to ground. The current through the clamp is sufficiently large to discharge any leakage current during open circuit and floating conditions at the input but small enough to protect against overloading the input source. One embodiment of the clamp circuit includes a bipolar first clamp transistor connected between the input and ground. A bipolar second clamp transistor, functioning as a diode, is connected between the base of the first clamp transistor and ground for controlling the first clamp transistor to allow current to flow from the input to ground.

In accordance with one embodiment of the current amplifier, it includes a first subcircuit having an input for receiving a signal from a CMOS logic driver and for generating a signal in response thereto. The clamp circuit is connected between the input of the first subcircuit and ground for shunting leakage currents during open and floating conditions. A plurality of bipolar transistors are arranged in a complementary Darlington configuration for generating a signal at an output in response to a signal from the first subcircuit. The signal at the output of the Darlington configuration is a logic "1" when a logic "1" signal is received at the input and a logic "0" when a logic "0" signal occurs at the input. The output is also at a logic "0" when an open circuit or floating condition is present at the input.

BRIEF DESCRIPTION OF THE DRAWINGS

The aforementioned and additional advantages of the present invention will be readily appreciated by those of ordinary skill in the art by reference to the following detailed description when considered in connection with the accompanying drawings in which.

DETAILED DESCRIPTION

Figure 1:
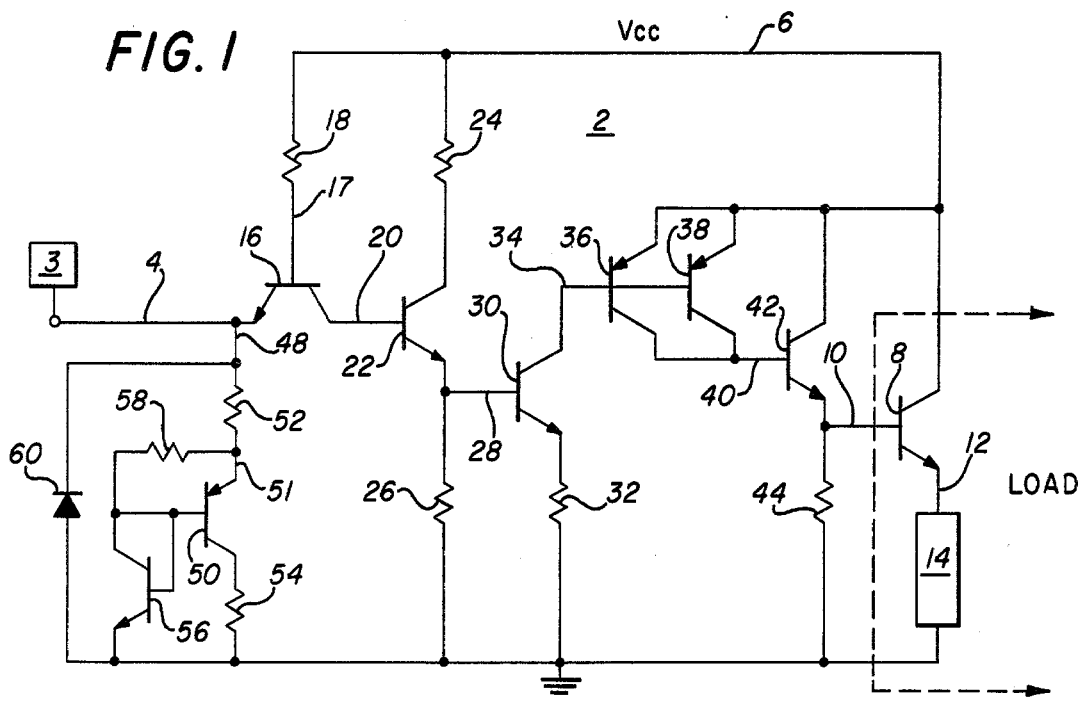
FIG. 1 is a schematic illustrating an embodiment of the CMOS Compatible Bipolar Print Drive Circuit with a protective clamp.

Referring now to FIG. 1, there is shown a drive circuit 2 utilizing bipolar transistor elements. When drive circuit 2 is used as a print element driver, logic drive circuitry 3 is connected to input line 4 and provides an input signal. A non-inverting HEX buffer Model No. C.D.4050 (RCA COS/MOS) is one example of logic drive circuitry 3 for driving the drive circuit 2. Electrical power is provided for the drive circuit 2 on a power line 6, and typically, a voltage (Vcc) of 12.0 volts is applied to the power line. A conventional output, medium power, transistor 8 is connected to an output line 10 of the drive circuit 2, and transistor 8 is connected by a line 12 to an electrical load 14. When drive circuit 2 is used as a part of a printer, electrical load 14 is typically a thermal print head in the form of a wafer.

An input transistor 16 is connected at its emitter to the input line 4. The base of input transistor 16 is connected to the power line 6 through a relatively large resistor 18, and a line 20 connects the collector of input transistor to the base of a second stage transistor 22. The collector electrode of the transistor 22 is connected to the power line 6 through a resistor 24, and the emitter is connected to ground through a resistor 26.

A line 28 connects the emitter of second stage transistor 22 to the base of a third stage transistor 30. The emitter of transistor 30 is connected to ground through a resistor 32, and a line 34 connects the collector of transistor 30 to the base electrode of transistors 36 and 38.

Transistors 36 and 38 are connected in parallel with the base, collector, and emitter of each transistor being directly interconnected. Transistors 36 and 38 are manufactured by a conventional process, preferably on the same chip, whereby the transistors are inherently matched. The inherent matching of transistors 36 and 38 allows equal distribution of current without the need of emitter balancing resistors. The interconnected emitters of transistors 36 and 38 are connected to the power line 6.

A line 40 connects the collectors of transistors 36 and 38 to the base of an output transistor 42. The transistor 42 includes an emitter that is connected to ground through a resistor 44 and a collector that is connected to the power line 6. The line 10 connects the emitter of transistor 42 to the output, medium power, transistor 8. In this arrangement, transistor 42 and transistors 36 and 38 are connected in a complementary Darlington configuration to provide the necessary current gain over an operating temperature range to drive the transistor 8. To maintain the proper output voltage level of 10.0 volts with load values from 8 ohms to 40 ohms, the Darlington current gain should exceed approximately 43 with the Darlington base current being approximately 3.5 milliamps. The resistor 44 stabilizes the output of transistor 42 on line 10 over the operating temperature range.

As will be hereinafter explained in greater detail, when input line 4 is maintained at a logic "0", no current flows through electrical load 14. Further, an input pulse, or logic "1", applied to line 4 will bias transistor 16 to an "on" condition, resulting in operation of drive circuit 2 to provide a current flow through load 14 having a duration related to the duration of the input pulse.

Often, however, an open circuit or floating condition will exist on line 4. When such a condition occurs, leakage current causes a voltage potential across the base-emitter junction of transistor 16 to edge upwards to the threshold which biases transistor 16 to permit current flow from the base through the collector of transistor 16. This biases transistor 22 to an "on" or conducting condition, initiating operation of drive circuit 2 and resulting in a steady state high current flow through load 14.

A protective clamp circuit is connected to the input line 4 of drive circuit 2 by a line 48. The current flow through line 48 is allowed to be sufficiently large to shunt leakage currents to ground during open circuit and floating conditions on input line 4 and yet small enough to protect against overloading the logic drive circuitry. The clamp circuitry connected to input line 4 through line 48 clamps the voltage on input line 4 at approximately 0.7 volts during open circuit and floating conditions. The voltage level of 0.7 volts on input line 4 represents a logic "0" level.

Transistor 50 of the clamp circuit has an emitter connected to input line 4 by means of a line 51, through resistor 52 and the line 48, and has a collector connected to ground through resistor 54. A bipolar transistor 56 has its base and collector interconnected, and both are connected to the base of transistor 50 and to the emitter of transistor 50 through a resistor 58. With this interconnection, transistor 56 acts as a diode and controls the flow of current through transistor 50. A diode 60 is connected between ground and line 48 and oriented to allow positive currents to flow from ground to input line 4 through line 48.

The protective clamp circuitry connected to input line 4 by line 48 constitutes an important feature of the present invention. When the voltage on input line 4 goes high to a logic "1", approximately 5 volts, a small current of 150 milliamps passes through the clamp circuit such that the voltage on line 51 at the emitter of transistor 50 is approximately 1.5 volts. However, the current flowing through line 48 is small enough such that the logic drive circuitry connected to input line 4 is not unduly loaded. When the voltage on input line 4 goes low to a logic "0", 0 voltage, no current passes through line 48 to ground. The voltage on input line 4 is, thus, clamped at approximately 0.7 volts when the input line is open or floating.

When the input line 4 of the print drive circuit 2 is allowed to see an open or floating condition, the voltage on the emitter and base terminals of transistor 16 can drift to a high level voltage. If a clamping circuit were not used, the high level voltage on the emitter of transistor 16 could create a logic "1" on input line 4 resulting in a steady state high current flow through the electrical load 14. The protective clamp circuitry connected to input line 4, in a sense, detects or senses the open circuit condition at the input and provides a shunt path to ground for leakage currents from the base to emitter terminals of transistor 16. The shunting of the leakage currents produces a logic "0" condition of approximately 0.7 volts at input line 4 and results in no appreciable current flow through the electrical load 14. Thus, the drive circuit 2 in conjunction with the protective clamp circuit connected at line 48 will deliver a logic "1" at the output line 10 for a logic "1" at the input line 4. A logic "0" occurs on the output line 10 when the input line 4 sees any condition other than a logic "1", such as a logic "0", an open circuit or a floating condition.

Figure 2:
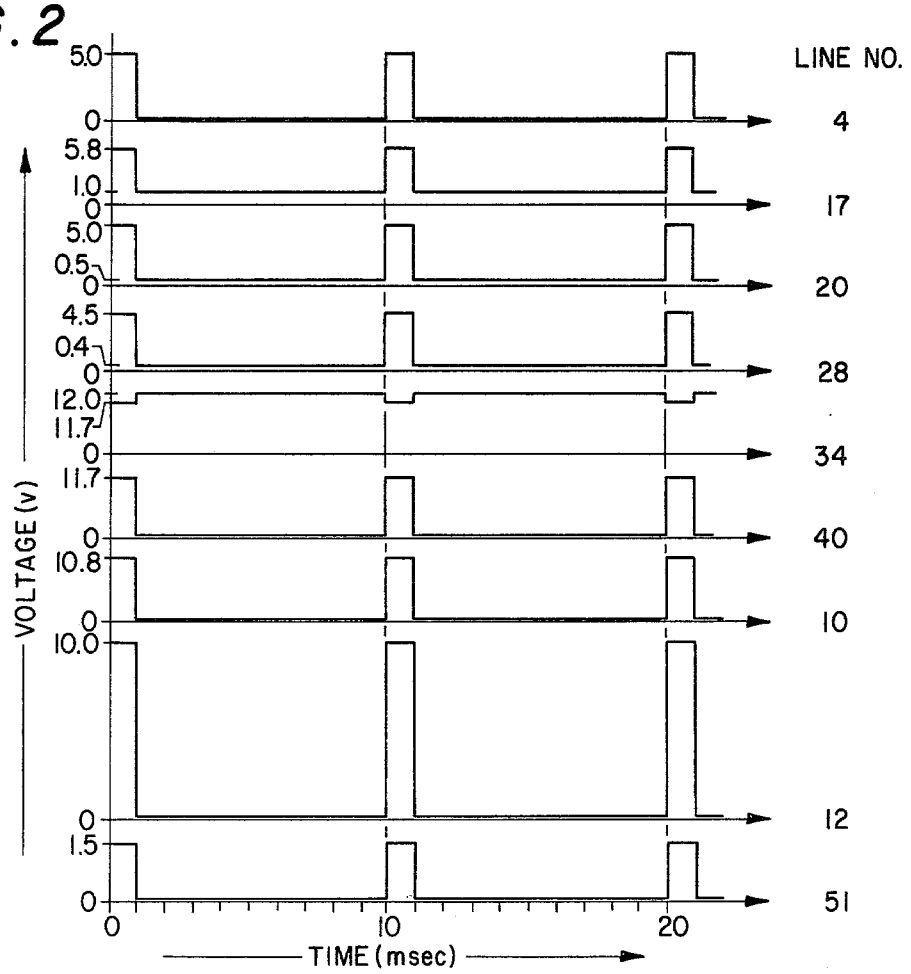
FIG. 2 is a graph illustrating the line voltages of the drive circuit shown in FIG. 1 when a five-volt, one-millisecond, 100 hertz pulse signal is applied at the input.

Referring now to FIGS. 1 and 2, the operation of each element of drive circuit 2 may be appreciated. FIG. 2 is a graph depicting various line voltages during the operation of drive circuit 2. By referring to FIGS. 1 and 2, a detailed understanding of the operation of drive circuit 2 may be obtained.

A five-volt, 1 millisecond voltage pulse is applied to input line 4 by logic drive circuitry to bring the input line to a high condition referred to as a logic "1". When the input line 4 goes to logic "1", the base of input transistor 16 goes to 5.8 volts to forward bias the base-emitter junction and turn on the input transistor. The voltage on line 20 increases to 5.0 volts which turns on the second stage transistor 22 to produce a voltage on line 28 of 4.5 volts. The 4.5 volts on line 28 causes the third stage transistor 30 to conduct and pulls the voltage on line 34 down from approximately 12 volts to 11.7 volts. Transistors 36 and 38 are now turned "on". When transistors 36 and 38 conduct, a voltage on the line 40 increases to approximately 11.7 volts. The transistor 42 is thus turned on raising the voltage on line 10 to approximately 10.8 volts.

The Darlington configuration of transistor 42 and transistors 36 and 38 provide sufficient current gain to drive the output transistor 8. A voltage of approximately 10 volts is, thus, generated on line 12 to drive the electrical load 14.

When a low voltage condition or a logic "0" is placed on input line 4, the print drive circuit 2 is turned "off". The voltage at the base of input transistor 16 drops to approximately 1 volt and the voltage on line 20 drops to 0.5 volts. The voltage on line 28 drops to approximately 0.4 volts and the voltage on line 34 rises to 12.0 volts. Thus, the voltage on lines 40, 10, and 12 is dropped to approximately 0 volts.

When an open or floating condition occurs on input line 4, leakage currents at the input line are shunted through line 48 and the clamping circuitry, and the voltage on the input line is clamped at 0.7 volts. In this manner a logic "0" is maintained on input line 4, and the voltages throughout the drive circuit 2 are the same for an open condition as for a logic "0" condition at the input line.

When input line 4 is subject to an open circuit or floating condition, the voltage at the emitter terminal of transistor 16 tends to drift upward. When the voltage on line 4 is less than one threshold voltage, 0.7 volts for silicon, transistors 50 and 56 are turned "off", and the clamp circuit is essentially an open circuit. When line 4 reaches 0.7 volts, transistor 56 is forward biased which connects line 4 to ground through resistors 52 and 58 and transistor 56. The impedance of these three elements is sufficiently low to drain the base to emitter leakage current (approximately 150 microamps) of transistor 16. The shunting of this leakage current to ground prevents the voltage on the emitter of transistor 16 from rising any further. Therefore, when line 4 is open or floating, it is clamped at one threshold voltage, approximately 0.7 volts.

When a logic "1", 5.0 volts, is applied to line 4, the current flow through resistor 58 is increased such that the emitter to base voltage of transistor 50 is raised to a level to forward bias transistor 50. The voltage at line 51 is clamped at two threshold voltages, approximately 1.5 volts, above ground due to the emitter-to-base junction of transistor 50 and the base-to-emitter junction of transistor 56. Thus, when 5.0 volts is applied to line 4, the current through line 48 is equal to 3.5 volts divided by the impedance of resister 52. This current flow is greater than the leakage current flow when line 4 is floating or open but is sufficiently low to prevent loading the driver circuit.

The print drive circuit 2 as shown in FIG. 1 is specifically designed to be integrated into a medium scale integration (MSI) chip by conventional design techniques. Preferably, each chip contains four print drivers. An MSI chip having the drive circuit 2 of the present invention for use in driving a printer will result in a substantial decrease in the number of total chips and total wire bonds necessary for a complete printer in comparison to many conventional print driver circuits.

Figures 3, 4:
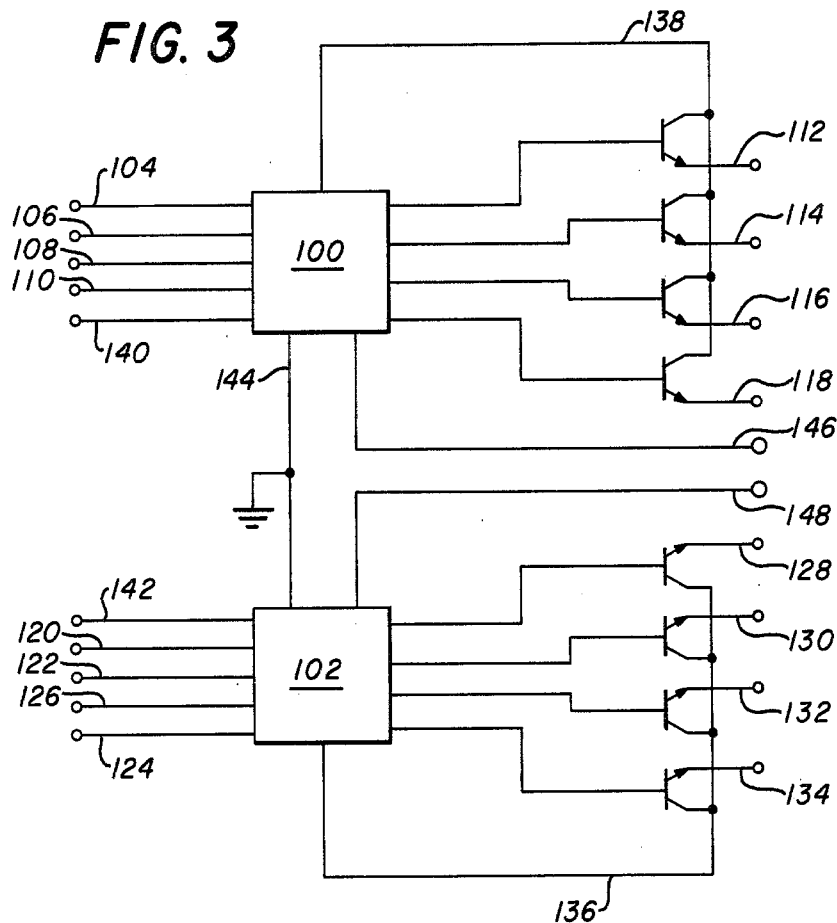
FIG. 3 is a block diagram of an eight-channel drive circuit with MSI chips in accordance with the present invention.
FIG. 4 is a table summarizing the performance characteristics of a drive circuit of the present invention.

Referring now to FIG. 3, a block diagram of an equivalent 8-channel driver circuit is shown. MSI chip 100 and 102 each include four drive circuits 2 as shown in FIG. 1. Input channels 104, 106, 108 and 110 are connected to MSI chip 100 and correspond to output channels 112, 114, 116 and 118, respectively. Likewise, input channels 120, 122, 124 and 126 are connected to MSI chip 102, and correspond to output channels 128, 130, 132 and 134. Lines 136 and 138 are connected to a power source (Vcc), and lines 140, 142, 144, 146 and 148 are connected to ground. In this configuration, each input and output of each channel functions as an individual circuit such as drive circuit 2 described in FIG. 1.

Referring now to FIG. 4, a table is shown compiling test results of a particular MSI chip having four drive circuits 2 as shown in FIG. 1. The tests were performed at various temperatures, duty cycles and input frequencies. The first column indicates the temperature of the chip when tested in degrees Centigrade. The second column indicates the voltage placed on the input line. The third column indicates that the interface with the chip was a CMOS interface. The fourth column indicates the duty cycle for frequencies other than steady state. The fifth column indicates the frequency of the input signal. The sixth column indicates the supply voltage, and the seventh column shows the worst case load. The final column, column eight, discloses the dissipation power in milliwatts of the circuit tested.

An important feature of the present invention is the extremely low power dissipation of the drive circuit 2 as indicated in column 8 of FIG. 4. It should be noted that the power dissipation shown in FIG. 4 represents worst case conditions when the load is 8 ohms. Typically, during normal operations, power dissipation will fall in the range of 3.0 milliwatts per channel at room ambient.

Thus, the drive circuit 2 of the present invention offers several advantages over the known prior art. The drive circuit 2 provides protection for the print wafer element of a printer when the drive circuit sees an open circuit or floating condition and has an extremely low power dissipation. No matching of components is required because of the inherent matching of the complementary Darlington driver output. Also, higher reliability is possible due to chip and wire bond reduction.

Although the present invention has been described with respect to particular embodiments, it will be understood that the invention is capable of numerous rearrangements, modifications and substitutions of parts without departing from the spirit of the invention.

What is claimed is:

1. A drive circuit for driving an electrical load in response to an input drive signal from a source thereof, comprising:
    first circuit means having an input and an output for generating a signal at said first circuit means output in response to the input drive signal at said first circuit means input;
    said circuit means having an input and an output for generating a logic level signal at said second circuit means output in response to said first circuit means generated signal at said second circuit means input, said second circuit means output being connected for driving the load;
    a first resistor having a first terminal thereof connected to said first circuit means input;
    a second resistor having a first terminal thereof connected to ground;
    a first clamp transistor having the collector and emitter terminals thereof connected between the second terminals of said resistors; and
    means connected to the base and collector terminals of said first clamp transistor and to ground for controlling current flow through said first clamp transistor.

2. A drive circuit for driving an electrical load in response to an input drive signal from a source thereof, comprising:
    first circuit means having an input and an output for generating a signal at said first circuit means output in response to the input drive signal at said first circuit means input;
    second circuit means having an input and an output for generating a logic level signal at said second circuit means output in response to said first circuit means generated signal at said second circuit means input, said second circuit means output being connected for driving the load;

a bipolar first clamp transistor having the emitter and collector terminals thereof connected respectively between said first circuit means input and ground;

a resistor connected between the emitter and base terminals of said first clamp transistor; and a diode connected between the base of said first clamp transistor and ground.

3. The drive circuit as set forth in claim 2 wherein said diode comprises a bipolar second clamp transistor connected between the base of said first clamp transistor and ground and functioning as a diode.

4. A drive circuit for driving an electrical load in response to an input drive signal from a source thereof, comprising:

first circuit means having an input and an output for generating a signal at said first circuit means output in response to the input drive signal at said first circuit means input;

second circuit means having an input and an output for generating a logic level signal at said second circuit means output in response to said first circuit means generated signal at said second circuit means input, said second circuit means output being connected for driving the load;

a clamp circuit connected between said first circuit means input and ground for shunting leakage currents from said first circuit means input during open circuit conditions at said first circuit means input, whereby said second circuit means output is maintained at a low voltage condition with no appreciable current flow through the load; and a diode connected between ground and said first circuit means input for allowing positive currents to flow from ground to said first circuit means input.

5. A drive circuit compatible logic drive circuitry connected through an output power transistor for driving a load, said drive circuit comprising:

first circuit means having an input for receiving a signal from the logic drive circuitry and for generating a signal in response thereto;

a clamp circuit connected between said input and ground for shunting leakage currents from said input during an open circuit condition at said input;

a plurality of transistors having an output and interconnected in a complementary Darlington amplifier configuration for generating a signal at said output in response to a signal from said first circuit means, said signal at said output being a logic "1" when a logic "1" signal is received at said input, said signal at said output being a logic "0" when a logic "0" is received at said input, said output being a logic "0" during open circuit and floating conditions at said input; and the output power transistor being connected to said output for conducting in response to a logic "1" signal from said output.

6. The drive circuit as set forth in claim 5 wherein said clamp circuit comprises:

a first resistor having a first terminal thereof connected to said input;

a second resistor having a first terminal thereof connected to ground;

a first PNP clamp transistor having the emitter terminal thereof connected to the second terminal of said first resistor and the collector terminal thereof connected to the second terminal of said second resistor;

a third resistor connected between the emitter and base terminals of said clamp transistor; and a diode connected between the base terminal of said first clamp transistor and ground.

7. The drive circuit as set forth in claim 6 wherein said diode comprises a second clamp transistor connected between the base of said first clamp transistor and ground for functioning as a diode.

8. A drive circuit for receiving a signal from logic drive circuitry and for driving a load in response thereto, said drive circuit comprising:

an input for receiving a signal from said logic drive cicuitry, said signal having a voltage level corresponding to a logic "0" and a voltage level corresponding to a logic "1";

a first transistor having an emitter connected to said input and a base connected to a power source, said first transistor being operable to turn "on" in response to a logic "1" at said input;

a second transistor having a base connected to the collector of said first transistor, said second transistor being operable to turn "on" in response to a signal generated by said first transistor;

a third transistor having its base connected to the emitter of said second transistor, said third transistor being operable to conduct in response to a signal generated by said second transistor;

fourth and fifth transistors being connected in parallel and having their bases connected to the collector of said third transistor, said fourth and fifth transistors being operable to turn "on" when said third transistor conducts;

a sixth transistor connected to said fourth and fifth transistors in a complementary Darlington configuration, said sixth transistor having a resistor connected to its emitter for stabilizing current gain over a selected temperature range;

a seventh, medium power, output transistor having the base thereof connected to the emitter of said sixth transistor and having the load connected to the emitter of said seventh transistor;

an eighth transistor having the emitter and collector connected between the input and ground;

a resistor connected between the emitter and base of said eighth transistor; and a diode connected between the base of said eighth transistor and ground.

* * * * *